Sept. 11, 1951 P. C. SHERERTZ 2,567,239
PULSE GENERATOR
Filed Aug. 24, 1949
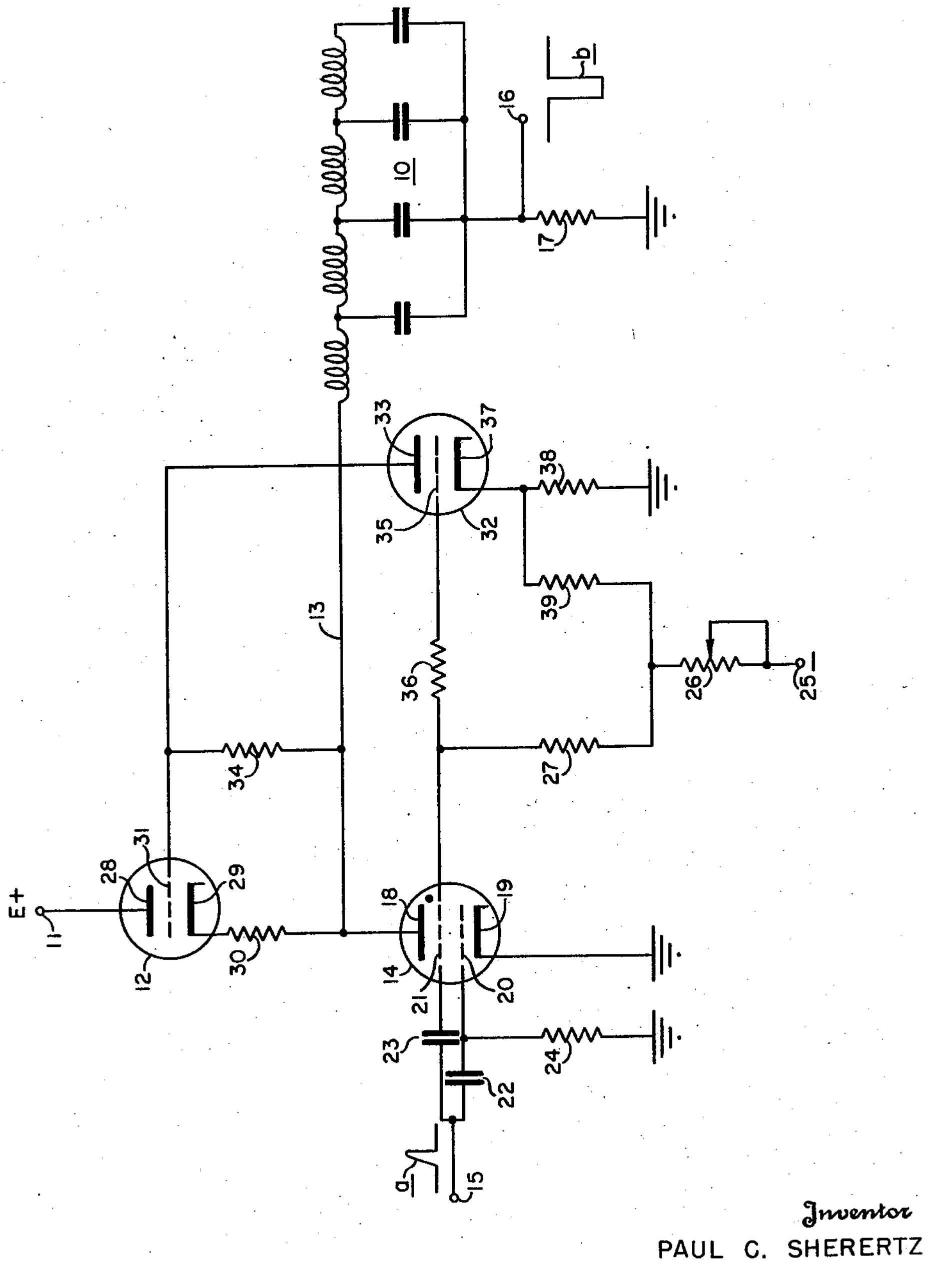
*Inventor*
PAUL C. SHERERTZ
By N. J. Horsfeld
ATTORNEY Patented Sept. 11, 1951 2,567,239

UNITED STATES PATENT OFFICE 2,567,239

PULSE GENERATOR

Paul C. Sherertz, Washington, D. C.

Application August 24, 1949, Serial No. 112,161

11 Claims. (Cl. 315—237)

(Granted under the act of March 3, 1883, as amended April 30, 1928; 370 O. G. 757)

This invention relates to pulse generators and more particularly to generators for producing fractional microsecond pulses having uniform predetermined characteristics throughout an extremely wide range of pulse repetition frequencies including a high pulse repetition frequency as compared to the optimum repetition frequencies of the pulse generators provided heretofore.

Prior pulse generators are incapable of operation to produce fractional microsecond pulses of substantially constant amplitude, duration and envelope shape throughout a wide range of pulse repetition frequencies. Moreover, the maximum pulse repetition frequency of the prior pulse generators at which the characteristics of the pulses are unaffected thereby is inherently low. In most pulse applications the operating efficiency increases with the pulse repetition frequency and it is therefore advantageous to provide means for producing undistorted pulses at previously unattainable high repetition frequencies.

It is therefore an object of the present invention to provide a novel pulse generator capable of producing a series of fractional microsecond pulses throughout an extremely wide range of pulse repetition frequencies.

Another object is to provide a novel generator for producing uniform pulses at a high repetition frequency unattainable by the generators of the prior art.

Another object is to provide a novel pulse generator wherein the duration, amplitude and envelope shape of the produced pulses are independent of the pulse repetition frequency at high repetition frequencies as compared to the optimum repetition frequencies of the prior pulse generators.

Still another object of the present invention is to provide a low impedance, externally triggered pulse generator including a pulse forming network and a novel charging circuit therefore designed to eliminate the use of passive charging elements capable of producing similar fractional microsecond pulses throughout a wide range of pulse repetition frequencies.

Still another object is to provide a pulse generator of the type including a pulse forming network charged during the interval between pulses and discharged through a low impedance circuit to form output pulses including a novel charging circuit for the network operable to obtain generation of pulses, having characteristics solely determined by the pulse forming network, at high pulse repetition frequencies unattainable by the prior art pulse generators.

Other objects and features of the present invention will appear more fully hereinafter from the following detailed description considered in connection with the accompanying drawing which discloses one embodiment of the invention. It is expressly understood however that the drawing is designed for purposes of illustration only and not as a definition of the limits of the invention, reference for the latter purpose being had to the appended claims.

The single figure of the drawing discloses a circuit diagram of a pulse generator constructed in accordance with the principles of the present invention.

Pulse generators of the present invention are of the type including a pulse forming network charged from a source of energy during the interval between pulses which is periodically or aperiodically discharged through a low impedance path to form output pulses. An electron discharge device of the type offering a low impedance when conducting, such as a gaseous electron discharge device, is employed to provide the low impedance discharge path. In operation, the gaseous electron discharge device is quenched simultaneously with termination of network discharge, with the network charged to a potential above ground corresponding to the cut-off potential of the gaseous device, and ionization persists an appreciable period of time after the quenching action, thus rendering the gaseous electron discharge device subject to self-triggering in response to a slight increase in its anode potential. In order to prevent self-triggering the prior pulse generators employ passive charging elements which substantially limit the higher range of pulse repetition frequencies without materially affecting the duration, amplitude and envelope shape of the produced pulses. The present invention overcomes these limitations by providing a novel charging circuit for the pulse forming network including a control circuit therefore operable in accordance with ionization and complete de-ionization of the gaseous electron discharge device.

The foregoing is more fully understood with particular reference to the drawing which discloses a pulse generator including a pulse forming network in the form of an open ended delay line 10. The delay line 10 is charged from a source of positive potential applied to a terminal 11, through an electron discharge device 12 and a conductor 13. The electron discharge device 12 is connected to function as a cathode follower for a purpose that will appear more fully hereinafter. A gaseous electron discharge device 14 provides a low impedance path to ground for discharge of the delay line 10 upon ionization thereof in response to triggering pulses, such as pulse *a*, applied to generator input terminal 15. Generator output terminal 16 is connected between the low potential side of the delay line 10 and a grounded resistance 17 having a value substantially equal to the characteristics impedance of of the line 10. With the foregoing arrangement, whenever the delay line 10 is discharged upon ionization of the discharge device 14 a negative pulse *b* is produced at the output terminal 16, the duration, amplitude and envelope shape of which are determined by the characteristics of the delay line 10.

The gaseous electron discharge device 14 includes an anode 18 connected to the conductor 13, a grounded cathode 19 and control electrodes 20 and 21 respectively coupled to the input terminal 15 by way of capacitors 22 and 23. The control electrode 20 is biased at ground potential by a resistor 24, and a negative biasing potential is normally maintained on the control electrode 21 by a connection thereto, including a potentiometer 26 and a coupling resistor 27, with a negative voltage source 25. Whenever the gaseous electron discharge device 14 is ionized the control electrode 21 is driven positive to approximately ground potential, and this positive bias persists following quenching of the discharge device 14 upon termination of discharge current therethrough for a period of time determined by the deionization rate of the gas and the time constant of the capacitor 23 and the resistor 27.

In order to prevent self-triggering of the gaseous electron discharge device 14 in response to line charging when ionized gas exists in the device 14 the present invention provides novel means for isolating the charging sources from the delay line 10 in response to ionization of the discharge device 14 and for re-establishing the charging circuit in dependency on complete deionization of the gas within the device 14, with the means characterized in such a manner as to allow the generator to function at a high pulse repetition frequency without distorting the pulses formed by the delay line 10. The foregoing means includes the cathode follower 12 and control means therefor operative in accordance with the bias on the control electrode 21 of the discharge device 14. The cathode follower 12 includes an anode 28 coupled to the terminal 11, a cathode 29 connected through isolating resistor 30 to the conductor 13, and a control electrode 31. The control means for the cathode follower 12 includes an electron discharge device 32, which may comprise a hard vacuum tube, having an anode 33 connected to the cathode follower control electrode 31 and to the conductor 13 through a resistor 34, a control electrode 35 coupled through a resistor 36 to the control electrode 21 of the discharge device 14, and a cathode 37 coupled to ground and to the potentiometer 26 through resistors 38 and 39, respectively. The electron discharge device 32 is normally blocked by the negative bias on the control electrode 35 and the more positive negative bias on the cathode 37 as determined by the resistors 38 and 39, however, when the electron discharge device 14 is ionized the resulting positive potential drawn by the control electrode 21 is sufficient to drive the electron discharge device 32 into conduction.

Upon conduction, the device 32 draws current from the line 10 through the resistor 34 and establishes a blocking bias on the control electrode 31 to interrupt the line charging circuit. Since ionized gas is present in the discharge device 14 for an appreciable period of time following quenching thereof, and since the line 10 is charged to a certain potential above ground at the time the device 14 is quenched, the blocking bias is maintained on the cathode follower 12 until the gaseous device 14 becomes completely deionized. It is understood that the rate of current flow through the device 32 is regulated to maintain the cathode follower 12 blocked throughout the ionization period of the device 14. Conduction of the device 32 also drops the potential of the line 10 below the cut-off potential of the gaseous device 14 and thereby prevents self-triggering of the device 14 in response to the abrupt potential increase at the anode 18 immediately following termination of line discharge.

The resistor 30 is not necessary for proper functioning of the charging circuit but may be included as an isolating impedance to prevent injury to the device 14 if the operator neglects to provide sufficient negative bias on the control electrode 21 or in the event of a failure in the negative bias supply circuit.

When the pulse generator described heretofore is in its quiescent state the gaseous electron discharge device 14 is non-ionized and the cathode follower 12 functions to complete the current charging path for delay line 10. Upon ionization of the gaseous device 14 in response to the triggering pulse *a* the potential of the anode 18 abruptly drops from the normal value thereof corresponding to the potential of the line 10 to a value several volts above ground potential equal to the normal conduction potential drop of the gaseous device 14. This negative pulse travels down the line 10, is reflected from the open end thereof, and, after a period of time equal to twice the delay of the line 10, the reflected negative pulse reaches the anode 18 and quenches the gaseous device 14. During discharge of the delay line 10 a negative pulse *b* appears at the output terminal 16; the duration, envelope shape, and amplitude of which are determined by the characteristics of the delay line 10.

At the instant of ionization the positive potential drawn by the control electrode 21 drives the discharge device 32 into conduction to discharge the line 10 to ground potential and to block the cathode follower 12 thereby terminating the flow of charging current to the line 10. The charging current path remains interrupted until the device 14 becomes completely deionized, at which time the control electrode 21 returns to its normal negative bias and terminates the clamping action of the discharge device 32.

There is thus provided by the present invention a novel pulse generator capable of producing fractional microsecond pulses, the duration, amplitude and envelope shape of which are solely determined by the characteristics of the pulse forming network completely independent of the pulse repetition frequency which may be varied throughout an extremely wide range including a high repetition frequency as compared to the optimum repetition frequencies of the prior pulse generators. The novel use disclosed and described heretofore of a gaseous electron discharge device including a control electrode for developing a control voltage in dependency on ionization and a cathode follower in the pulse forming network charging circuit operable in accordance with the control voltage through a clamping tube which also functions to reduce the network potential below the cut-off potential of the gaseous discharge device, provides a pulse generator capable of the foregoing operation wherein pulses having characteristics solely determined by the pulse forming network are produced at high pulse repetition frequencies unattainable by pulse generators of the prior art. In actual practice pulse generators of the present invention have produced uniform, undistorted 100 volt pulses of fractional microsecond duration throughout a wide range of pulse repetition frequencies up to 3500 pulses per second. Moreover, pulse generators of the present invention are inherently low impedance circuits and may be coupled to driven circuits without distortion.

Although only one embodiment of the present invention has been disclosed and described herein it is expressly understood that various changes and substitutions may be made therein without departing from the spirit of the invention as well understood by those skilled in the art. Reference therefore will be had to the appended claims for a definition of the limits of the invention.

The invention described herein may be manufactured and used by or for the Government of the United States of America for governmental purposes without the payment of any royalties thereon or therefor.

What is claimed is:

1. In a pulse generator having a pulse forming network, a cathode follower means coupled to said network for charging the same, and a low impedance discharge means coupled to said network for discharging the same through a load circuit.

2. In a pulse generator having a pulse forming network, a cathode follower means coupled to said network for charging the same, and an ionizable electron discharge device coupled to said network for discharging the same through a load circuit upon ionization thereof.

3. In a pulse generator having a pulse forming network, a cathode follower means coupled to said network for charging the same, an ionizable electron discharge device coupled to said network for discharging the same through a load circuit upon ionization thereof, and blocking means coupled to said cathode follower means and responsive to the ionization of said discharge device for rendering said cathode follower means ineffective to charge said network.

4. In a pulse generator having a pulse forming network, a charging means coupled to said network, an ionizable electron discharge device coupled to said network for discharging the same through a load circuit upon ionization thereof, and means coupled to said discharge device and responsive to ionization thereof to render said charging means ineffective to charge said network.

5. In a pulse generator having a pulse forming network, charging means coupled to said network, an ionizable electron discharge device coupled to said network for discharging the same through a load circuit upon ionization thereof, a normally non-conducting electron discharge device coupled to said ionizable discharge device and responsive to ionization thereof to be rendered conductive, and means responsive to conduction of said normally non-conducting discharge device for rendering said charging means ineffective to charge said network.

6. A pulse generator comprising a charged open ended delay line, a gaseous electron discharge device connected to said line to provide a low impedance discharge path therefore, trigger means for ionizing said gaseous electron discharge device, a charging circuit for said line including a normally conducting cathode follower forming a conductive path between a source of charging energy and said line, and means for blocking said cathode follower in dependency on the presence of ionized gas in said gaseous electron discharge device.

7. A pulse generator comprising an open ended delay line, a charging circuit including a source of current and a normally conducting cathode follower feeding said line, a gaseous electron discharge device providing a low impedance path to ground for said line when ionized in response to external control pulses, means associated with said device for producing a control voltage in dependency on ionization of said device, and clamping means operable in accordance with said control voltage for applying a blocking bias to said cathode follower to interrupt charging current to said line.

8. A pulse generator comprising an open ended delay line, a charging circuit including a source of current and a normally conducting cathode follower feeding said line, a gaseous electron discharge device for discharging said line to a potential equal to the cut-off potential of said device when ionized in response to a control signal, means producing a control voltage in dependency on ionization of said device, and means including an electron discharge device operative in response to said control voltage for blocking said cathode follower in accordance therewith to interrupt charging current to said line and for discharging said line to a potential value below the cut-off potential of said device.

9. A pulse generator comprising an open ended delay line, a charging circuit including a source of current and a normally conducting cathode follower feeding said line, a gas filled electron discharge device including an anode connected to said line, a grounded cathode and a normally negatively biased control electrode drawing positive potential in response to ionization of said gas, an electron discharge device having an anode connected to said line through a resistance, a negatively biased cathode and a control electrode coupled to the control electrode of said gas filled device, and means utilizing the voltage drop developed across said resistance upon conduction of said electron discharge device in accordance with ionization of said gas to control said cathode follower.

10. A pulse generator comprising an open ended delay line having an output circuit coupled thereto, a charging circuit including a source of current and a normally conducting cathode follower feeding said line, a gas-filled electron discharge device having an anode fed from said cathode follower through an isolating impedance, a grounded cathode and a control electrode normally biased negative with respect to ground, a vacuum tube having an anode connected to said line through a resistance, a negatively biased cathode and a control electrode coupled to the control electrode of said gas-filled device, means ionizing the gas of said gas-filled device to discharge said line to a potential above ground corresponding to the cut-off potential of said gas-filled device and to drive the control electrode thereof sufficiently positive in response to the presence of ionized gas for rendering said vacuum tube conducting so that a voltage drop appears across said resistance and said line is discharged through said vacuum tube to a potential less than the cut-off potential of said gas-filled device, and means employing said voltage drop to block said cathode follower and interrupt charging current to said line throughout the presence of ionized gas in said gas-filled device.

11. A pulse generator having a pulse forming network, a cathode follower means coupled to said network for charging the same, an ionizable electron discharge device coupled to said network for discharging the same through a load circuit upon ionization thereof to a potential equal to the cut-off potential of said device when ionized, and means coupled to said cathode follower means and said network and responsive to the ionization of said discharge device for rendering said cathode follower ineffective to charge said network and for discharging said network to a potential below the cut-off potential of said device.

PAUL C. SHERERTZ.

REFERENCES CITED

The following references are of record in the file of this patent:

FOREIGN PATENTS

| Number | Name | Date |
|---|---|---|
| 2,310,092 | Knowles | Feb. 2, 1943 |